United States Patent
Yoshidome et al.

(10) Patent No.: US 9,534,286 B2
(45) Date of Patent: Jan. 3, 2017

(54) PVD TARGET FOR SELF-CENTERING PROCESS SHIELD

(71) Applicant: APPLIED MATERIALS, INC., Santa Clara, CA (US)

(72) Inventors: Goichi Yoshidome, Emeryville, CA (US); Ryan Hanson, Cupertino, CA (US); Donny Young, San Jose, CA (US); Muhammad Rasheed, San Jose, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 293 days.

(21) Appl. No.: 13/837,742

(22) Filed: Mar. 15, 2013

(65) Prior Publication Data

US 2014/0261180 A1    Sep. 18, 2014

(51) Int. Cl.
*C23C 14/34* (2006.01)
*H01J 37/34* (2006.01)

(52) U.S. Cl.
CPC ....... *C23C 14/3407* (2013.01); *H01J 37/3414* (2013.01); *H01J 37/3435* (2013.01); *Y10T 428/218* (2015.01); *Y10T 428/219* (2015.01)

(58) Field of Classification Search
CPC ............. C23C 14/3407; H01J 37/32651; H01J 37/3441
See application file for complete search history.

(56) References Cited

U.S. PATENT DOCUMENTS

| | | | |
|---|---|---|---|
| 6,073,830 A | 6/2000 | Hunt et al. | |
| 7,097,744 B2 | 8/2006 | Liu et al. | |
| 7,618,520 B2* | 11/2009 | Wu et al. | 204/298.12 |
| 2004/0079634 A1* | 4/2004 | Wickersham et al. | 204/298.12 |
| 2004/0251130 A1* | 12/2004 | Liu et al. | 204/298.01 |
| 2005/0199491 A1* | 9/2005 | Gung | C23C 14/046 204/298.11 |
| 2007/0295602 A1* | 12/2007 | Tiller et al. | 204/298.11 |
| 2009/0045051 A1 | 2/2009 | Ferrasse et al. | |
| 2010/0108500 A1* | 5/2010 | Hawrylchak et al. | 204/298.13 |
| 2012/0199469 A1 | 8/2012 | Rasheed et al. | |

FOREIGN PATENT DOCUMENTS

JP        08-053757 A        2/1996

OTHER PUBLICATIONS

International Search Report and Written Opinion mailed Jun. 16, 2014 for PCT/US2014/021658.

* cited by examiner

*Primary Examiner* — John Brayton
(74) *Attorney, Agent, or Firm* — Moser Taboada; Alan Taboada

(57) ABSTRACT

In some embodiments, a target assembly, for use in a substrate processing chamber having a process shield, may include a backing plate having a first side and an opposing second side, wherein the second side comprises a first surface having a first diameter bounded by a first edge; a target material having a first side bonded to the first surface of the backing plate; wherein the first edge is an interface between the backing plate and the target material; a plurality of slots disposed along an outer periphery of the backing plate extending from the first side of the backing plate toward the second side of the backing plate, wherein the plurality of slots are configured to align the target assembly with respect to the process shield.

18 Claims, 6 Drawing Sheets

PVD TARGET FOR SELF-CENTERING PROCESS SHIELD

FIELD

Embodiments of the present invention generally relate to physical vapor deposition processing equipment.

BACKGROUND

In current physical vapor deposition (PVD) chambers, a process shield is typically mounted to the main body of the PVD chamber, separately from the target. The target is typically mounted on a removable lid of the PVD chamber and then lowered onto the chamber body for processing. However, the inventors have discovered that such a configuration may undesirably result in the process shield and the target being inaccurately aligned. The inventors have further discovered for applications using higher frequencies of radio frequency (RF) energy applied to the target, the alignment between the target and shield becomes more critical to controlling any plasma irregularity and arc events, which may negatively affect the quality of deposition in the PVD chamber. Current PVD chambers utilize features that are separate from the target and the process shield to align the two components. However, the inventors have observed that such features fail to adequately align the target and process shield for certain applications.

Accordingly, the inventors have provided improved apparatus for PVD processing.

SUMMARY

Apparatus for physical vapor deposition are provided. In some embodiments, a substrate processing chamber may include a chamber body having an inner volume; a chamber lid disposed atop the chamber body, wherein the chamber lid comprises an axis of rotation configured to rotate the chamber lid onto the chamber body; a process shield disposed within the chamber body and below the chamber lid; and a target assembly coupled to a lower surface of the chamber lid that faces the inner volume when in a closed position, the target assembly comprising a backing plate having a first side and an opposing second side, wherein the second side comprises a first surface having a first diameter bounded by a first edge; a target material having a first side bonded to the first surface of the backing plate; wherein the first edge is an interface between the backing plate and the target material; and a first plurality of slots disposed along an outer periphery of the backing plate extending from the first side of the backing plate toward the second side of the backing plate, wherein the plurality of slots are configured to align the target assembly with respect to the process shield when the lid is in the closed position.

In some embodiments, a target assembly, for use in a substrate processing chamber having a process shield, may include a backing plate having a first side and an opposing second side, wherein the second side comprises a first surface having a first diameter bounded by a first edge; a target material having a first side bonded to the first surface of the backing plate; wherein the first edge is an interface between the backing plate and the target material; a plurality of slots disposed along an outer periphery of the backing plate extending from the first side of the backing plate toward the second side of the backing plate, wherein the plurality of slots are configured to align the target assembly with respect to the process shield.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
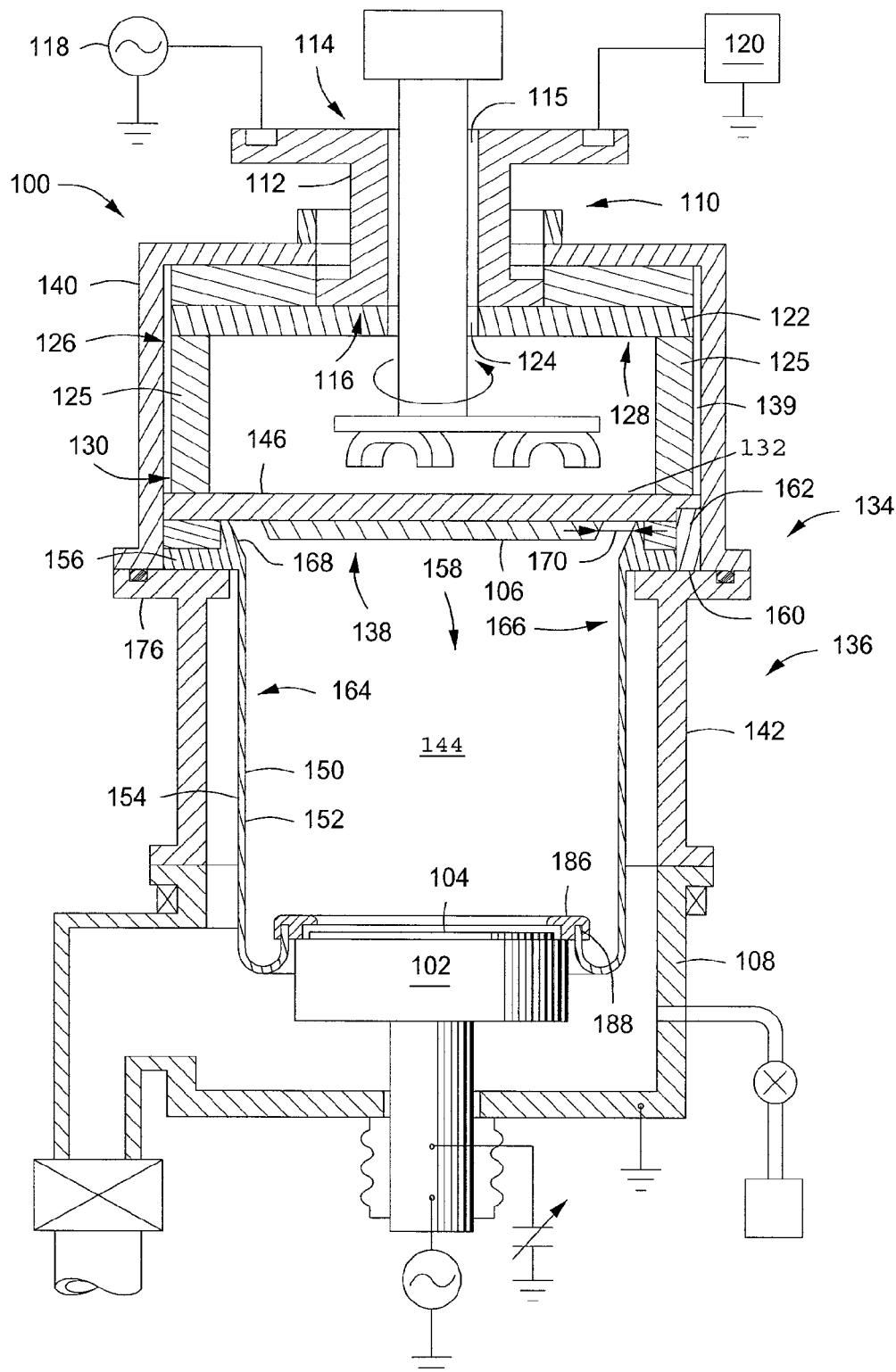
FIG. 1 depicts a schematic cross-sectional view of a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for improved physical vapor deposition (PVD) processing equipment are provided herein. The present invention provides improved target assembly designs that may be utilized with a range of very high frequency RF frequencies and/or source materials for sputter deposition in a PVD chamber. Embodiments of the target assembly of the present invention may advantageously reduce or prevent arcing between the target material and the process shield and improve wafer deposition symmetry by providing improved alignment between the process shield and the target material. As used herein, the term align or alignment refers to the concentric placement of the target material and the process shield, such that a gap of a first distance between an outer edge of the target material and an inner surface of the process shield body proximate the target material is substantially uniform.

FIG. 1 depicts a schematic, cross-sectional view of a physical vapor deposition chamber, or process chamber 100, in accordance with some embodiments of the present invention. Examples of suitable PVD chambers include the ENDURA® PVD processing chamber, commercially available from Applied Materials, Inc., of Santa Clara, Calif. Other processing chambers from Applied Materials, Inc. or other manufactures may also benefit from the inventive apparatus disclosed herein.

In some embodiments, the process chamber 100 has a chamber lid 134 disposed atop a chamber body 136. The chamber body has an inner volume 144. The process chamber 100 further comprises a process shield 150, disposed within the chamber body 136 and below the target assembly 138. The process shield 150 prevents deposition of sputtered target material onto the sidewalls of the chamber, for example, the upper chamber adapter 142. As depicted in FIG. 1, the process shield 150 is supported within the chamber body 136 atop a first support member 176. In some embodiments, the first support member 176 may be a ledge of the upper chamber adapter 142.

The process shield 150 comprises an elongated annular body 164 having an outer surface 154 and an inner surface 152 defining a central opening 158 of the elongated annular body 164. In some embodiments, the elongated annular body 164 is made of a conductive material, such as stainless steel, aluminum, or the like. A lip 156 extends radially outward from the outer surface 154 of the elongated annular body 164 proximate a first end 166 of the elongated annular body 164 such that a first portion 168 of the elongated annular body 164 extends beyond the lip 156 toward the first end 166. The lip 156 comprises a plurality of openings 160. A pin 162 is disposed in each of the openings 160. The pins 162 may be made of a suitable process-compatible dielectric material to electrically isolate the RF hot target assembly 114 from the grounded process shield 150. In some embodiments, the pins 162 are fabricated from ceramic (e.g., aluminum oxide). In some embodiments, the pins 162 are press fit into the openings 160 and cannot be removed from the openings. In some embodiments, the pins 162 can be fit into the openings by cooling the pins 162 to contract their size while heating the shield to enlarge the openings 160 before placing the pins 162 therein. At room temperature, the pins 162 will enlarge and the openings will contract, improving the fit of the pins 162 within the openings 160.

The chamber lid 134 can be rotatably opened from atop the chamber body 136, for example, to install or replace a target or for performing maintenance on the process chamber 100. In some embodiments, the chamber lid 134 may be moveable about a horizontal axis of rotation at least from a closed position, as illustrated in FIG. 1, to an open position. For example, the chamber lid 134 moves in an arc about the axis of rotation between the closed position and the open position. In some embodiments, the chamber lid 134 includes a target assembly 138. The target assembly 138 is coupled to a lower surface of the chamber lid 134 that faces the inner volume 144 of the chamber body 136 when the chamber lid 134 is in the closed position.

Figure 2A:
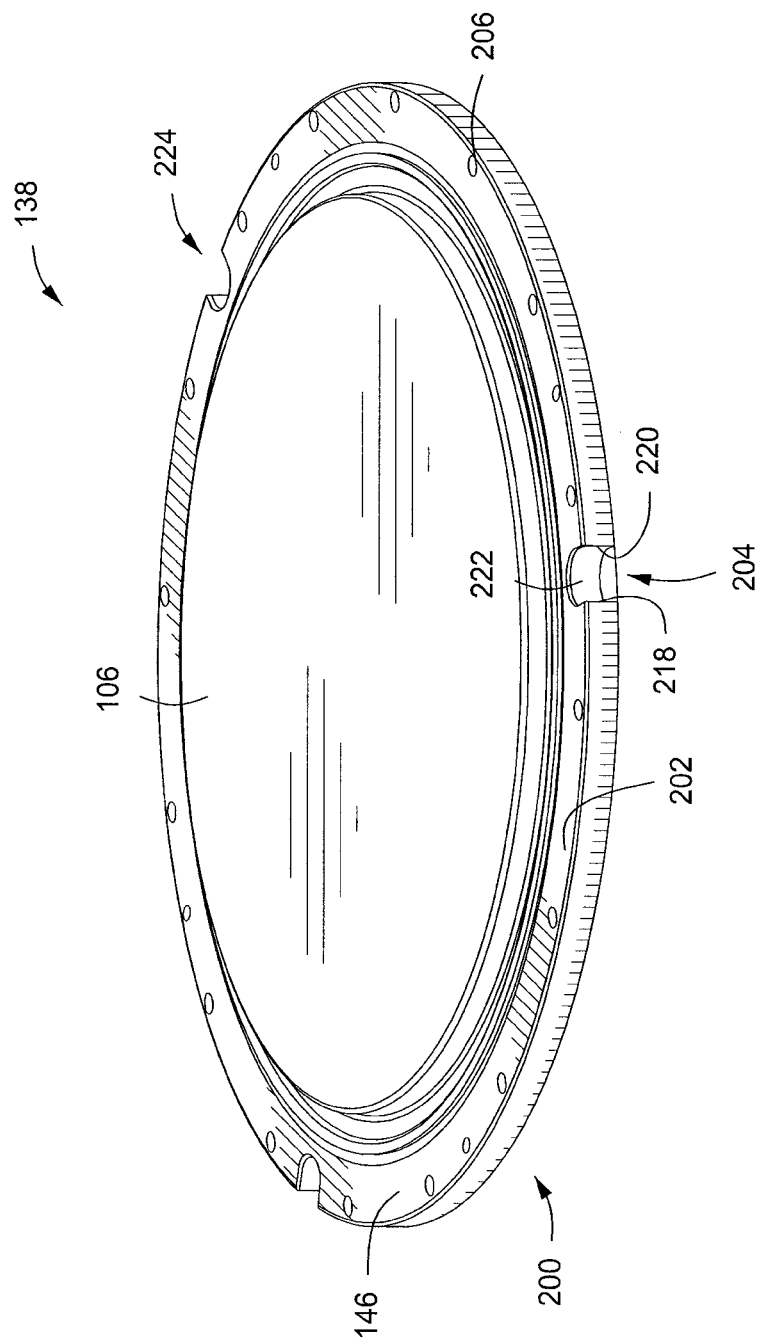
FIG. 2A-2C depict various views of a target assembly in accordance with some embodiments of the present invention.
Figure 2B:
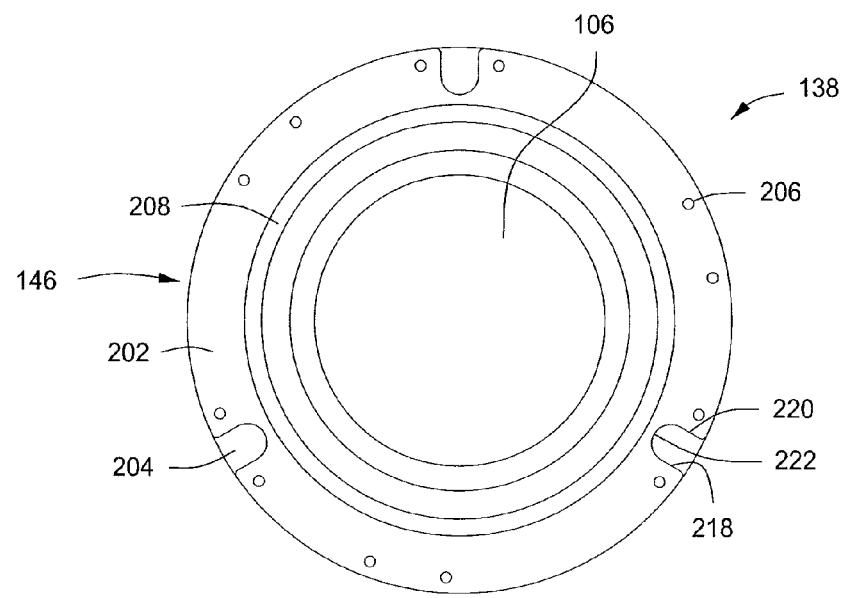
Figure 2C:
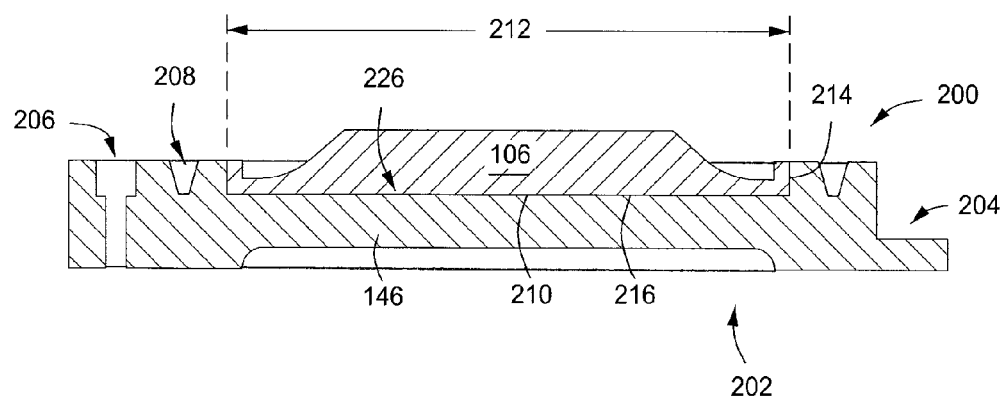

FIGS. 2A-2C depicts various views of the target assembly 138 in accordance with some embodiments of the present invention. The target assembly 138 comprises a backing plate 146 that supports a target material 106. The backing plate 146 comprises a first side 200 and an opposing second side 202 and may be circular or other shape as required to support a target having a particular shape and to fit in a chamber having a particular geometry. The second side 202 comprises a recess 226 defined by a first surface 210 having a first diameter 212 bounded by a first edge 214 (as shown in FIG. 2C). In some embodiments, the first diameter 212 is about 17.10 inches to about 17.60 inches.

In some embodiments, the backing plate 146 may comprise a conductive material, such as copper-zinc, copper-chrome, or the same material as the target material 106, such that RF and DC power can be coupled to the target material 106 via the backing plate 146. Alternatively, the backing plate 146 may be non-conductive and may include conductive elements (not shown) such as electrical feedthroughs or the like. In some embodiments, the thickness of the backing plate is about between about 0.50 inches to about 0.620 inches.

As best seen in FIG. 2C, the target material 106 is disposed in the recess 226 and has a first side 216 bonded to the first surface 210 of the backing plate 146. The first edge 214 is an interface, also referred to as the bond line, between the backing plate 146 and the target material 106. The first diameter 212, is selected to ensure that only the target material 106 and not the backing plate 146 is within the dark space region, between the outer edge of the target material and an inner surface 152 of the process shield body 164 Not having the backing plate 146 within the dark space region advantageously avoids sputtering of the backing plate material. The target material 106 comprises a material to be deposited on a substrate 104 during sputtering, such as a metal or metal oxide. In some embodiments, the target material may be titanium, cobalt, tantalum, or copper.

A first plurality of slots 204 is disposed along an outer periphery 224 of the backing plate 146 extending from the first side 200 of the backing plate 146 toward the second side 202 of the backing plate 146. The plurality of slots 204 are configured to align the target assembly 138 above the process shield 150. As depicted in FIG. 2A, each slot is generally U-shaped, having the opening facing radially outward. For example, each slot 204 may include a first linear surface 218 parallel to a second linear surface 220 connected by an arched surface 222. The distance between the first linear surface 218 and the second linear surface 220 is about 0.75 inches to about 1.00 inch.

As discussed below with respect to FIGS. 3A-3B, 4A-4B, and 5A-5B, as the chamber lid 134 rotates into the closed position; the plurality of slots 204 engage the process shield 150, for example by the pins 162 configured to fit into the slots 204, to guide the entire target assembly 138 into alignment atop the process shield 150 such that the outer edge of the target material is advantageously disposed a first distance 170, representing the dark space region, from an inner surface 152 of the process shield body 164 proximate the first end 166 in order to reduce arcing and enhance uniformity of the deposition process. In some embodiments, the first distance is between about 0.030 inches to about 0.065 inches.

In some embodiments, as depicted in FIGS. 2A-2C, the plurality of slots 204 are three slots 204, although other numbers of slots, for example a number of slots 204 equal to the number of pins 162 in the process shield 150, may be provided in other embodiments. In such embodiments, the first slot, the second slot and the third slot engage the process shield 150 to align an outer edge of the target material 106 a first distance 170 from an inner surface of the process shield 150.

In some embodiments with three slots, a first slot and a second slot are aligned with and closer to an axis of rotation of the chamber lid 134 than a third slot, thereby allowing the first and second slots to engage the process shield 150 prior to the third slot. The first slot and second slot engage the process shield 150, for example by the pins, at substantially the same time. This advantageously allows the pins 162 of the process shield 150 to share the weight of the chamber lid 134 at two points, as it descends atop the chamber body 136. This initial engagement of the target assembly 138 with the first pin and second pin begins to align the target assembly 138. The engagement of the third slot with the process shield 150 advantageously provides a final alignment of the target assembly 138 before the chamber lid 134 closes atop the chamber body 136. As discussed below with respect to FIGS. 3A-3B, 4A-4B, and 5A-5B, the final alignment of the target assembly 138 aligns an outer edge of the target material 106 a first distance 170 from an inner surface 152 of the process shield body 164 proximate the first end 166.

In some embodiments having three slots 204, a center of the first slot is located about 115 degrees from a center of the second slot and the center of the second slot is located about 115 degrees from a center of the third slot. In some embodiments having three slots, the center to center location of the slots as discussed above can be greater than or less than 115 degrees from each other. Providing slots having centers at >115° leads to a more vertical component, and hence more front to back misalignment. Providing slots having centers at <115° leads to a less vertical component, and hence less front to back misalignment. However, a greater amount of force would be needed to overcome o-ring friction. Although three slots and pins are shown in the drawings, more pins (i.e., >3) can also be used to provide greater alignment.

A plurality of counterbore holes 206 disposed along an outer periphery 224 of the backing plate 146 extends from the first side 200 of the backing plate 146 toward the second side 202 of the backing plate 146. The plurality of counterbore holes 206 is configured to couple the target assembly 138 to the chamber lid 134.

In some embodiments, a groove 208 is disposed along an outer periphery 224 of the second side 202 of the backing plate 146 between the plurality of slots 204 and the first edge 214. A seal is disposed in the groove 208 to create a seal between the backing plate 146 and an opposing surface.

Figure 3A:
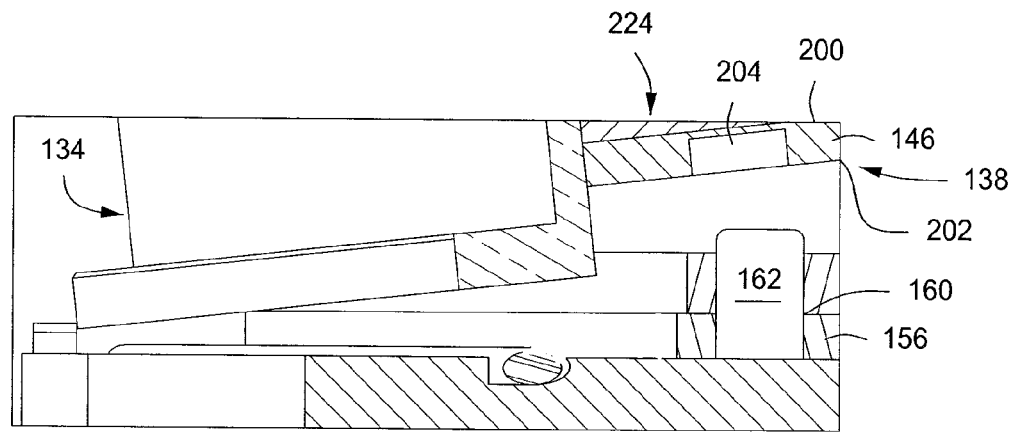
FIGS. 3A-3B depict a sectional view of a target assembly and surrounding structure in a first position in accordance with some embodiments of the present invention.

FIG. 3A depicts the target assembly 138, the pin 162 and surrounding structure, prior to engagement between the target assembly 138 and the pin 162. The chamber lid 134 is in a partially closed position. As described above, the slot 204 is disposed along an outer periphery 224 of the backing plate 146 extending from the first side 200 of the backing plate 146 toward the second side 202 of the backing plate 146. The pin 162 may extend in a substantially normal direction from a bottom of the opening 160 in the lip 156.

Figure 3B:
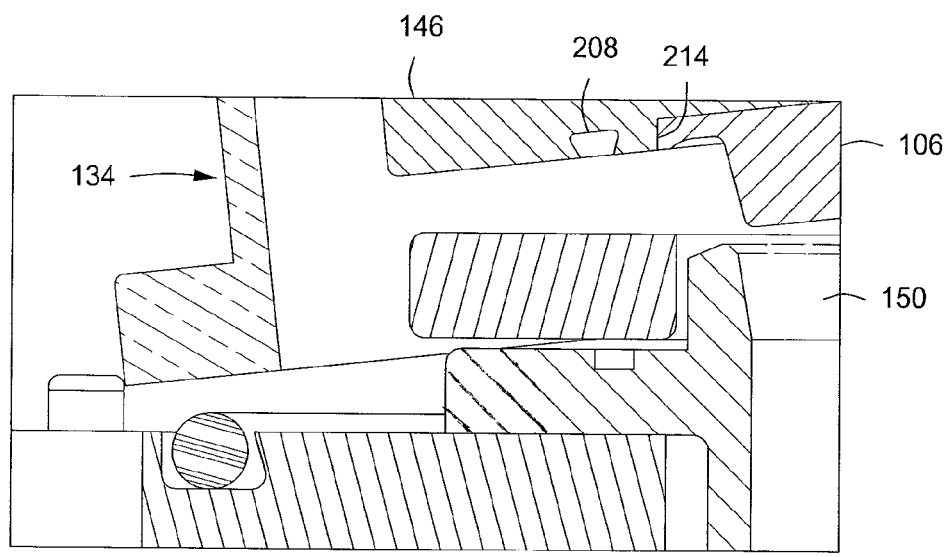

In some embodiments, the process shield 150 may comprise alignment features, such as pins 162, to interface with, or fit into, the slots 204 in the target assembly 138. In some embodiments, as depicted in FIG. 3A, the process shield 150 may comprise a pin 162 configured to engage the slot 204 in the backing plate 146. The number of pins 162 in the process shield 150 equal the number of slots 204 in the backing plate. The placement of the pins 162 in the process shield 150 mirror the placement of the slots 204 in the backing plate 146 to allow the pins 162 to engage the slots 204 and align the target assembly 138 with the process shield 150. As depicted in FIG. 3B, prior to engagement between the target assembly 138 and the process shield 150, the target material 106 is disposed above the process shield 150.

Figure 4A:
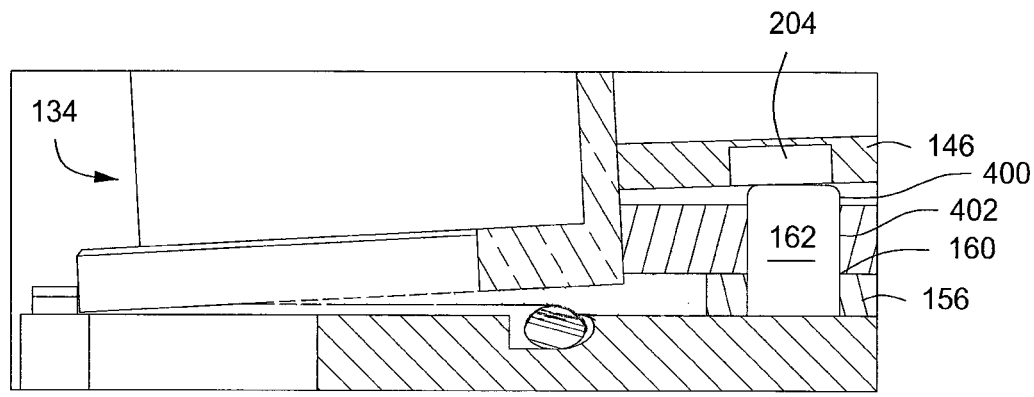
FIGS. 4A-4B depict a sectional view of a target assembly and surrounding structure in a second position in accordance with some embodiments of the present invention.
Figure 4B:
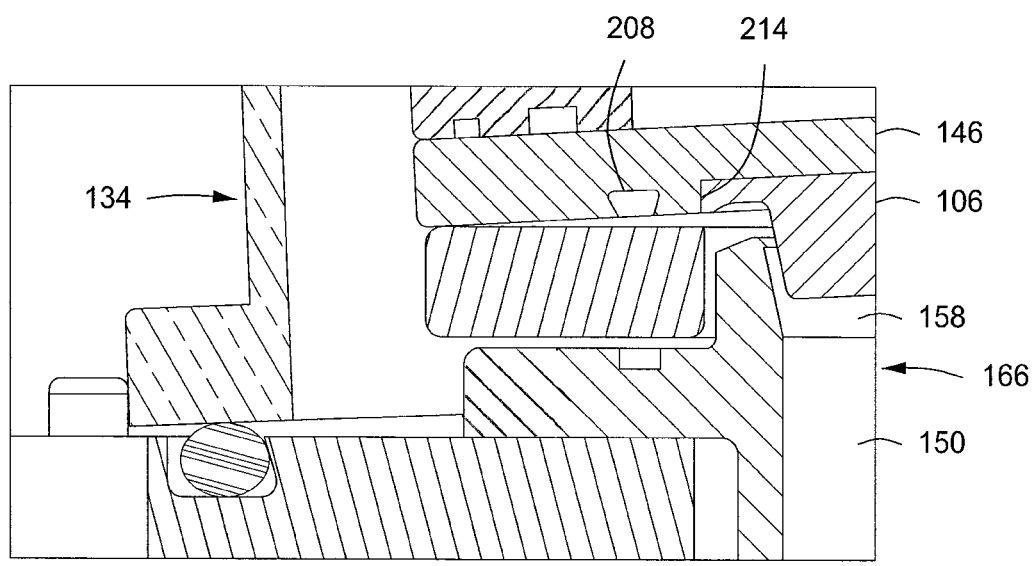

FIG. 4A depicts the target assembly 138, the pin 162 and surrounding structure, as a slot 204 closest to the axis of rotation of the chamber lid 134 makes contact with one of the pins 162 of the process shield 150. In some embodiments, as depicted in FIG. 4A, the outer edge of slot 204 contacts the beveled peripheral edge 400 of the pin 162. The beveled peripheral edge 400 advantageously allows the slot 204 to slide down the beveled peripheral edge 400 and over a portion of the side wall 402 extending above the top surface of the lip 156. As depicted in FIG. 4B, as the pin 162 contacts the slot 204, the target material 106 enters the central opening 158 of the process shield 150 proximate the first end 166. As depicted in FIG. 4B, the outer edge of the target material 106 is configured to avoid contacting an inner surface of the process shield 150 as the target assembly 138 rotates in an arc onto the process shield 150. In some embodiments, the outer edge of the target material 106 is angled toward the center of the target material 106 at about 10 degrees to about 20 degrees from vertical (or normal to the target surface).

Figure 5A:
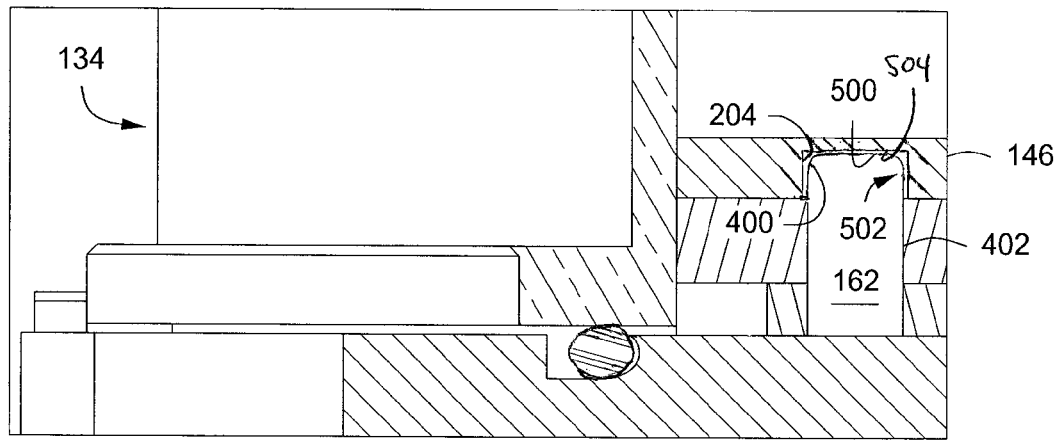
FIGS. 5A-5B depict a sectional view of a target assembly and surrounding structure in a third position in accordance with some embodiments of the present invention.
Figure 5B:
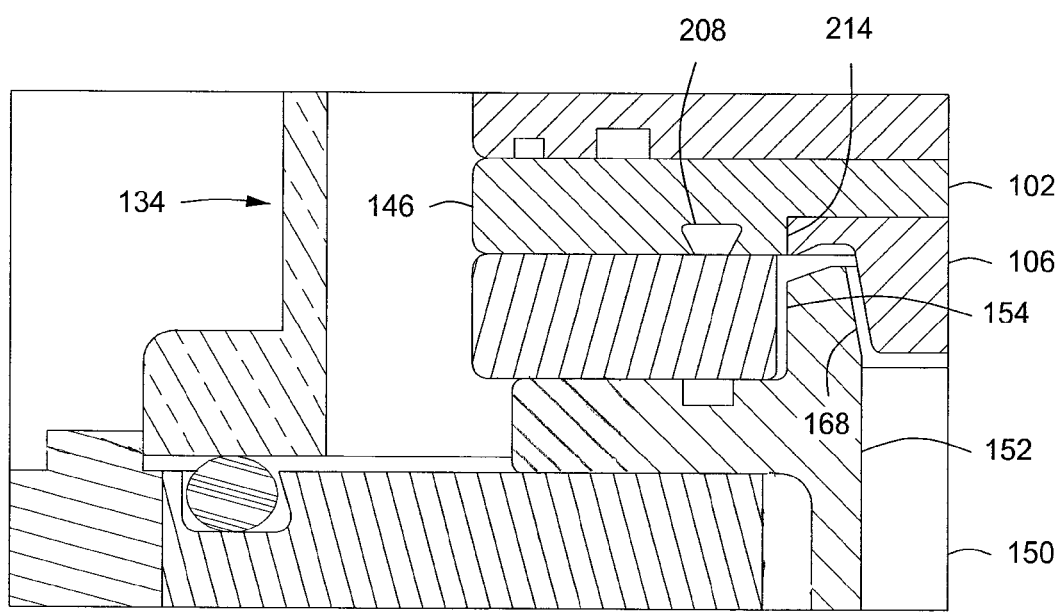

FIG. 5A depicts the target assembly 138, the pin 162 and surrounding structure as the target assembly 138 aligns with the process shield 150. In some embodiments, as depicted in FIG. 5A, a first portion of the pin 162 comprising the first surface 500, the beveled peripheral edge 400 and a first portion 502 of the sidewall 402 is engaged within the slot 204. The first surface 500 of the pin 162 does not contact the upper surface 504 of the slot 204. Once the pin 162 is fully engaged with the slot 204 in the target assembly 138, the target material 106 is aligned with the process shield 150 to prevent or minimize arcing between the target material 106 and process shield 150. As depicted in FIG. 5B, the first edge 214, representing an interface between the backing plate 146 and the target material 106, extends the target material 106 above a first portion 168 of the elongated annular body 164 from the inner surface 152 to the outer surface 154 to advantageously reduce re-sputtering of the backing plate 146.

Returning to FIG. 1, in some embodiments, the feed structure 110 couples RF and, optionally, DC energy to the target 106. Although a particular feed structure 110 is described below, other feed structures having other configurations may also be utilized. In some embodiments, the feed structure 110 may include a body 112 having a first end 114 that can be coupled to an RF power source 118 and, optionally, a DC power source 120, which can be respectively utilized to provide RF and DC energy to the target 106. A second end 116 of the feed structure 110, opposite the first end 114, is coupled to the chamber lid 134. In some embodiments, the body 112 further includes a central opening 115 disposed through the body 112 from the first end 114 to the second end 116. The feed structure 110 may be fabricated from suitable conductive materials to conduct the RF and DC energy from the RF power source 118 and the DC power source 120.

In some embodiments, the chamber lid 134 may further include a source distribution plate 122 to distribute the energy applied via the feed structure 110 to the peripheral edge of the target 106 via a conductive member 125. As such, in some embodiments, the second end 116 of the body 112 may be coupled to the source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the backing plate 146 of the target 106) proximate the peripheral edge of the target 106.

A ground shield 140 may be provided to cover the outside surfaces of the chamber lid 134. The ground shield 140 may be coupled to ground, for example, via the ground connection of the chamber body 136. In some embodiments, the ground shield 140 may have a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the distribution plate 122, the conductive member 125, and the target 106 (and/or backing plate 146) to prevent the RF and DC energy from being routed directly to ground. The insulative gap may be filled with air or some other suitable dielectric material, such as a ceramic, a plastic, or the like.

The chamber body 136 contains a substrate support pedestal 102 for receiving a substrate 104 thereon. The substrate support pedestal 102 may be located within a grounded enclosure wall 108, which may be a chamber wall (as shown) or a grounded shield. The ground shield 140 may cover at least some portions of the chamber 100 above the target 106.

The process shield 150 extends along the walls of the upper chamber adapter 142 and the chamber wall 108 downwardly to below a top surface of the substrate support pedestal 102 and returns upwardly until reaching a top surface of the substrate support pedestal 102. A cover ring 186 rests on the top of the upwardly extending inner portion 188 of the process shield 150 when the substrate support pedestal 102 is in its lower, loading position but rests on the outer periphery of the substrate support pedestal 102 when it is in its upper, deposition position to protect the substrate support pedestal 102 from sputter deposition.

While the foregoing is directed to embodiments of the present invention, other and further embodiments of the invention may be devised without departing from the basic scope thereof.

The invention claimed is:

1. A target assembly for use in a substrate processing chamber having a process shield, the target assembly comprising:
   a backing plate having a first side and an opposing second side, wherein the second side comprises a first surface having a first diameter bounded by a first edge;
   a target material having a first side bonded to the first surface of the backing plate; wherein the first edge is an interface between the backing plate and the target material; and
   three slots disposed along an outer periphery of the backing plate to align the target assembly with respect to the process shield during use, wherein the three slots are formed in the first side of the backing plate and extend only partially into the backing plate, wherein a center of a first slot is located at a first angle of about 115 degrees from a center of a second slot, the center of the second slot is located at a second angle of about 115 degrees from the center of a third slot, and the center of the first slot is located at a third angle of about 130 degrees from the center of the third slot, and wherein the third angle is greater than each of the first and second angles.

2. The target assembly of claim 1, wherein the target material is one of titanium, cobalt, tantalum, or copper.

3. The target assembly of claim 1, wherein the thickness of the backing plate is between about 0.50 inches to about 0.62 inches.

4. The target assembly of claim 1, wherein the backing plate comprises a conductive material.

5. The target assembly of claim 1, further comprising a groove disposed along an outer periphery of the second side between the three slots and the first edge, and a seal disposed in the groove.

6. The target assembly of claim 1, wherein the first diameter is about 17.10 inches to about 17.60 inches.

7. The target assembly of claim 1, wherein an outer edge of the target material is tapered to avoid contacting an inner surface of the process shield as the target assembly rotates in an arc onto the process shield.

8. The target assembly of claim 1, further comprising a plurality of counterbore holes disposed along an outer periphery of the backing plate extending from the first side of the backing plate through the second side of the backing plate.

9. The target assembly of claim 1, wherein each slot comprises a first linear surface parallel a second linear surface connected by an arched surface and an open end disposed along the outer periphery of the backing plate.

10. The target assembly of claim 9, wherein a distance between the first linear surface and the second linear surface is about 0.75 inches to about 1.00 inch.

11. A substrate processing chamber, comprising:
    a chamber body having an inner volume;
    a chamber lid disposed atop the chamber body, wherein the chamber lid comprises a horizontal axis of rotation configured to rotate the chamber lid in an arc between an open position and a closed position;
    a process shield disposed within the chamber body and below the chamber lid, the process shield including three pins extending upward from an end of the process shield adjacent the chamber lid; and
    a target assembly coupled to a lower surface of the chamber lid that faces the inner volume when in the closed position, the target assembly comprising:
       a backing plate having a first side and an opposing second side, wherein the second side comprises a first surface having a first diameter bounded by a first edge;
       a target material having a first side bonded to the first surface of the backing plate; wherein the first edge is an interface between the backing plate and the target material; and
       three slots disposed along an outer periphery of the backing plate to align the target assembly with respect to the process shield when the chamber lid is in the closed position, wherein the three slots are formed in the first side of the backing plate and extend only partially into the backing plate, wherein a first slot and a second slot are aligned with and closer to the axis of rotation of the chamber lid than a third slot so that the first slot and the second slot are configured to engage the pins of the process shield at substantially a same time and prior to the third slot, and wherein a distance between the first slot and the second slot is greater than a distance between the third slot and either of the first or second slots.

12. The target assembly of claim 11, wherein the three slots engage the pins of the process shield to align an outer edge of the target material a first distance from an inner surface of the process shield.

13. The substrate processing chamber of claim 11, wherein each slot comprises a first linear surface parallel to a second linear surface connected by an arched surface and an open end disposed along the outer periphery of the backing plate.

14. The substrate processing chamber of claim 13, wherein a distance between the first linear surface and the second linear surface is about 0.75 inches to about 1.00 inch.

15. The target assembly of claim 1, wherein the center of the first slot is located 115 degrees from the center of the second slot, and wherein the center of the second slot is located 115 degrees from the center of the third slot.

16. The substrate processing chamber of claim 11, wherein a center of the first slot is located about 115 degrees from a center of the second slot, the center of the second slot is located about 115 degrees from a center of the third slot, and the center of the first slot is located about 130 degrees from the center of the third slot.

17. The substrate processing chamber of claim 16, wherein the center of the first slot is 115 degrees from the center of the second slot, the center of the second slot is 115 degrees from the center of the third slot, and the center of the first slot is 130 degrees from the center of the third slot.

18. A target assembly for use in a substrate processing chamber having a process shield, the target assembly comprising:

a backing plate having a first side and an opposing second side, wherein the second side comprises a first surface having a first diameter bounded by a first edge;

a target material having a first side bonded to the first surface of the backing plate, wherein the first edge is an interface between the backing plate and the target material; and three slots disposed along an outer periphery of the backing plate to align the target assembly with respect to the process shield during use, wherein the three slots are formed in the first side of the backing plate and extend only partially into the backing plate, wherein each slot comprises a first linear surface parallel a second linear surface connected by an arched surface and an open end disposed along the outer periphery, wherein a center of a first slot is located at a first angle of 115 degrees from a center of a second slot, the center of the second slot is located at a second angle of 115 degrees from the center of a third slot, and the center of the first slot is located at a third angle of 130 degrees from the center of the third slot.

\* \* \* \* \*